(12) United States Patent
Ferreira et al.

(10) Patent No.: US 10,573,360 B1
(45) Date of Patent: Feb. 25, 2020

(54) METHOD AND APPARATUS FOR ADAPTABLE PHASE TRAINING OF HIGH FREQUENCY CLOCK SIGNALING FOR DATA CAPTURE

(71) Applicant: MOTOROLA SOLUTIONS, INC., Chicago, IL (US)

(72) Inventors: Johnny R. Ferreira, Sunrise, FL (US); Charles R. Ruelke, Coral Springs, FL (US)

(73) Assignee: MOTOROLA SOLUTIONS, INC., Chicago, IL (US)

( * ) Notice: Subject to any disclaimer, the term of this patent is extended or adjusted under 35 U.S.C. 154(b) by 0 days.

(21) Appl. No.: 16/204,698

(22) Filed: Nov. 29, 2018

(51) Int. Cl.
| | | |
|---|---|---|
| *G11C 8/18* | (2006.01) | |
| *G11C 7/22* | (2006.01) | |
| *G06F 1/04* | (2006.01) | |
| *G11C 7/10* | (2006.01) | |
| *G11C 11/4076* | (2006.01) | |
| *G11C 29/02* | (2006.01) | |

(52) U.S. Cl.
CPC ........... *G11C 7/222* (2013.01); *G11C 7/1066* (2013.01); *G11C 7/1072* (2013.01); *G11C 8/18* (2013.01); *G11C 11/4076* (2013.01); *G11C 29/022* (2013.01); *G11C 29/023* (2013.01); *G11C 29/028* (2013.01)

(58) Field of Classification Search
CPC ..... G11C 7/222; G11C 7/1066; G11C 7/1072; G11C 8/18; G11C 11/4076; G11C 29/023; G11C 29/028; G11C 29/022

USPC ................ 365/194, 233.1, 193, 233.12, 191; 372/291; 713/401
See application file for complete search history.

(56) References Cited

U.S. PATENT DOCUMENTS

| | | | |
|---|---|---|---|
| 5,867,717 A * | 2/1999 | Milhaupt | G06F 1/08 713/323 |
| 6,493,285 B1 | 12/2002 | Wolford | |
| 6,940,768 B2 | 9/2005 | Dahlberg et al. | |
| 2008/0123445 A1* | 5/2008 | Vergnes | G11C 29/02 365/194 |
| 2008/0181046 A1* | 7/2008 | Vergnes | G06F 13/1689 365/233.1 |
| 2009/0077409 A1* | 3/2009 | Matulik | G06F 13/1689 713/401 |

(Continued)

*Primary Examiner* — Ly D Pham
(74) *Attorney, Agent, or Firm* — Michael Best & Friedrich LLP (57) ABSTRACT

A method and apparatus for adaptable phase training of high frequency clock signaling for data capture is provided. A state machine synchronizes a first selection signal to a delay multiplexer and a second selection signal to a digital block demultiplexer to sequentially select a targeted pair of the static storage elements for each of a plurality of phase-delayed data strobe clock signals. Read back data from an external memory captured by the static storage elements is compared to known valid data. The state machine determines which of the plurality of phase-delayed data strobe clock signals resulted in known valid data being captured by the static storage elements based on the comparison. The state machine selects one of the plurality of phase-delayed data strobe clock signals that resulted in valid data being captured as a read clock signal for a memory controller to capture subsequent read data from the external memory.

20 Claims, 7 Drawing Sheets

(56) References Cited

U.S. PATENT DOCUMENTS

2013/0033946 A1\* 2/2013 Ware .................. G06F 13/1689
365/193

\* cited by examiner

METHOD AND APPARATUS FOR ADAPTABLE PHASE TRAINING OF HIGH FREQUENCY CLOCK SIGNALING FOR DATA CAPTURE

BACKGROUND OF THE INVENTION

Electronic devices may interface to memory devices through interfaces operating at high clock frequencies to transfer data. To reduce complexity inherent in the memory devices themselves, some memory devices do not include an internal clock, alternatively, operating based on clock signals received from a controller external to the memory device that may be affiliated with the electronic device.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION OF THE INVENTION

In response to a read request from the electronic device to the memory, for example, data signals from the memory are transferred using a read-back data strobe signal being in phase with the read-back data, wherein the read-back data strobe signal is a phase-delayed representation of the clock signal received from the controller. Due to the internal buffers and delays of the memory, the data output of the memory is not phase aligned with the clock of the controller. Accordingly, there is a need for an improved interface of clock signaling used between an electronic device and a memory device.

Figure 1:
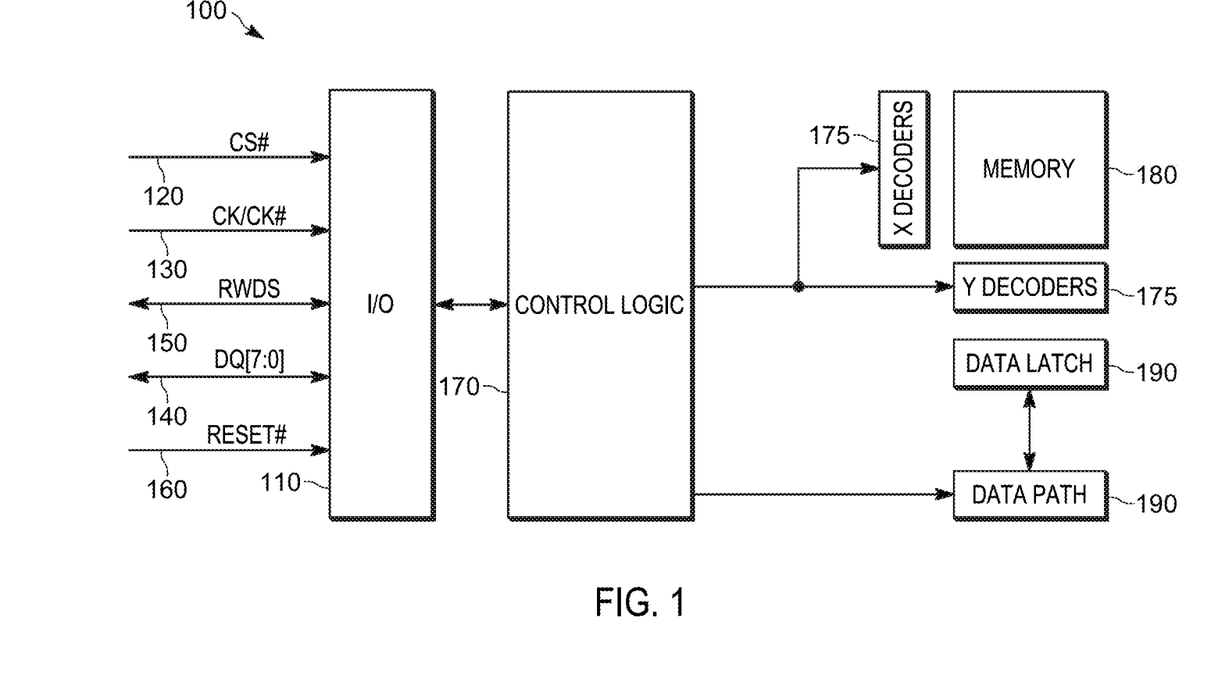
FIG. 1 illustrates an external memory in accordance with some embodiments.

FIG. 1 is a block diagram of an external memory 100 in accordance with some embodiments. In one example, the external memory 100 is a 64-Mb HyperRAM™ device sold by Cypress®, but other external memories are used in some embodiments. The external memory 100 is a high-speed memory without an internal clock. The external memory 100 is configured to transfer data to a host device using a Double Data Rate (DDR) protocol that transfers, for example, 8-bit wide data for each clock edge. The external memory 100 includes an input/output interface 110 having several signal lines including an enable signal 120, a host clock signal 130, data lines 140, read write data strobe (RWDS) signal 150, and a reset signal 160.

The enable signal 120 (that is, chip select) is received from a host device (see, for example, memory controller 210 of FIG. 3) to enable or select the external memory 100 for operation. In one example, transactions with the external memory 100 are enabled when the enable signal 120 transitions from HIGH to LOW, transactions remain enabled while the enable signal 120 remains low, and transactions with the external memory 100 are disabled when the enable signal 120 transitions from LOW to HIGH. The host clock signal 130 may be a differential clock signal or a single ended clock signal received from a host device. In the example illustrated, the data lines 140 include 8-bit lines (lines [7:0]) to transfers address and data between the external memory 100 and a host device. In some embodiments, the input/output interface 110 has a different number of data lines 140, for example, four, sixteen, thirty-two, or sixty-four data lines.

The RWDS signal 150 is exchanged between the external memory 100 and a host device and performs several functions during read and write operations. During a write operation from the device to the external memory 100, the external memory 100 receives a data-masked RWDS signal 150 indicating which data byte being written should be stored in the external memory 100. During a read operation, where data is read from the external memory 100 back to the host device, the host clock signal 130 is processed by the external memory 100, which then outputs the RWDS signal 150 back to the host device. The RWDS signal 150 output from the external memory 100 has the same frequency as the host clock signal 130, but may be phase-delayed from the host clock signal 130 (that is, the RWDS signal 150 output by the external memory 100 is a phase-delayed version of the host clock signal 130). The rising and falling edges of the RWDS signal 150 from the external memory 100 are aligned (that is, synchronous) with the data output on the data lines 140. The reset signal 160 is received by the external memory 100 to perform a hardware reset of the external memory 100. In one example, the external memory 100 will self-initialize and return to a standby state when the reset signal 160 is LOW.

The external memory 100 also includes control logic 170, XY decoders 175, memory cells 180, and data path 190 between the memory cells 180 and the control logic 170. The control logic 170 receives the command and address information from the input/output interface 110 and activates the corresponding memory cell 180 through the XY decoders 175. In read-back operations, control logic 170 generates the RWDS signal 150 by phase delaying the host clock signal 130 sufficient to access the targeted registers in the memory cells 180, while ensuring that the RWDS signal 150 is synchronous with the read-back data being sent to the host device through the input/output interface 110. The data to be read from the activated memory cells 180 or to be written to the activated memory cells 180 is transferred through the data path 190. The memory cells 180 store the data received over the data path 190.

Figure 2:
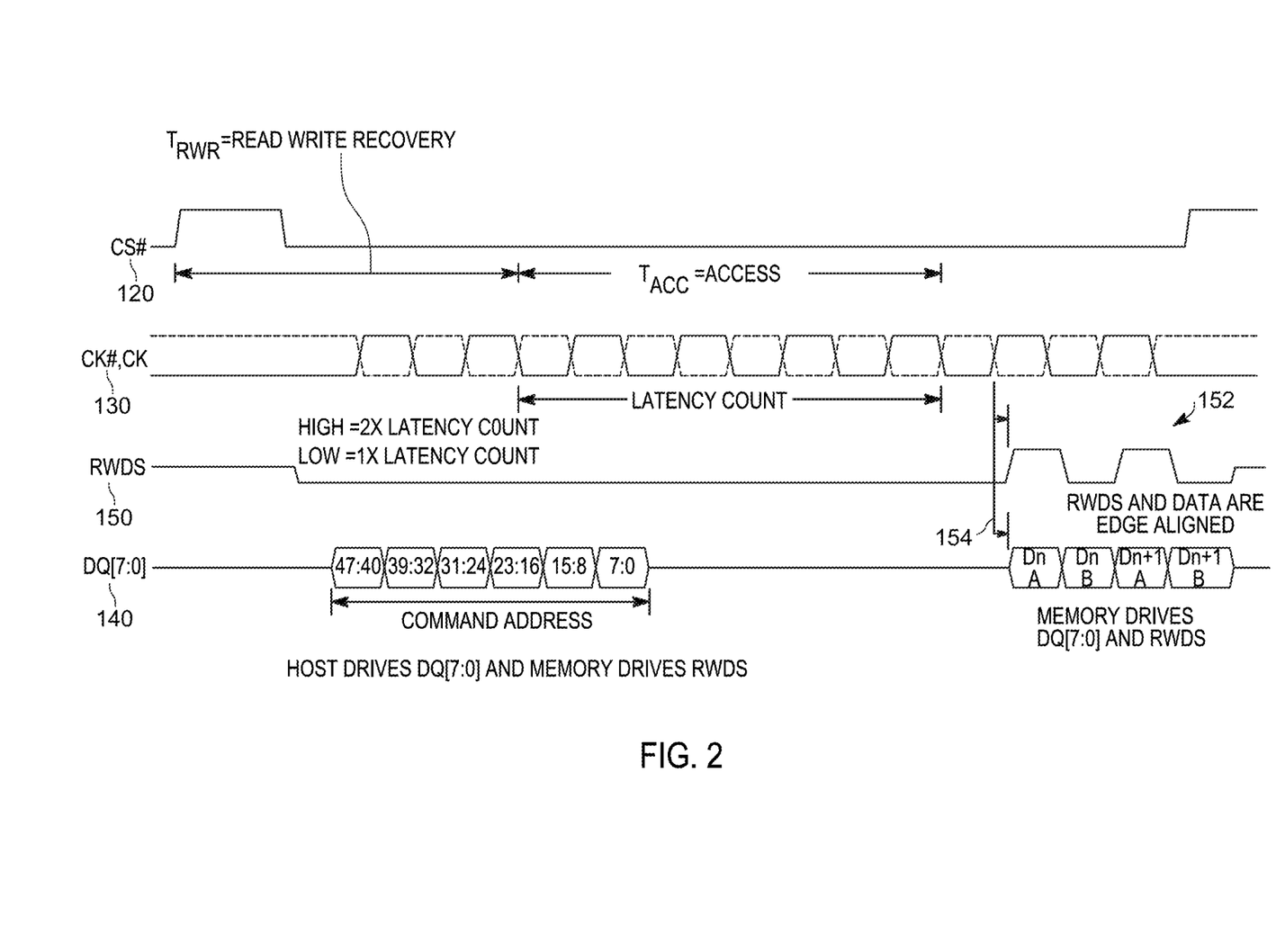
FIG. 2 illustrates a timing diagram of a read operation of the external memory of FIG. 1 in accordance with some embodiments.

FIG. 2 is a timing diagram of a read transaction performed by the external memory 100. As discussed above, a transaction performed by the external memory 100 is initiated when the enable signal 120 transitions from HIGH to LOW. When enabled, the external memory 100 drives the RWDS signal 150 HIGH or LOW to indicate a latency count of the external memory 100. The latency count indicates the read latency of the external memory 100 to inform when data will be available after data address is received.

The external memory 100 receives command-address information on data lines 140 from the host device after the host clock signal 130 is enabled from the host device. The command-address includes the operation to be performed (that is, read or write) and the address of the data that is to be captured from the external memory 100. The external memory 100 transmits data, retrieved from the memory cells 180 as indicated by the received address from the host device, on the data lines 140. In concert with asserting the data, the control logic 170 within the external memory 100 drives the RWDS signal 150 with the phase-delayed clock signal 152. As described above, the RWDS signal 150 output by the external memory 100 has the same frequency as the host clock signal 130, but is phase-delayed from the host clock signal 130 by a phase delay 154. The phase-delay 154 is introduced due to the delays caused by the control logic 170 and buffers that translate the host clock signal 130 to the RWDS signal 150 in the external memory 100. The data on the data lines 140 is edge-aligned with the phase-delayed clock signal 152 on the RWDS signal 150, with the data on the data lines 140 updating on both the rising and falling edge of the phase-delayed clock signal 152.

Because of the phase delay 154 between the host clock signal 130 and the assertion of new data on data lines 140, the data cannot be latched into data registers of the host device based on the internal clock of the host device. Accordingly, there is a need for an improved interface of clock signaling used between an electronic device and a memory device and for phase tuning the clock signals provided to internal registers of the host device to properly capture data read from the external memory 100.

One embodiment provides an electronic device including a memory controller configured to generate a master clock signal and an external memory coupled to the memory controller. The external memory is configured to receive the master clock signal and provide a data strobe (DS) clock signal to the memory controller, the DS clock signal being a phase-delayed version of the master clock signal. The electronic device also includes a plurality of cascaded delay elements configured to receive the data strobe clock signal and generating a plurality of phase-delayed data strobe clock signals. The electronic device further includes a delay multiplexer configured to receive the plurality of phase-delayed data strobe clock signals and configured to output one of the plurality of phase-delayed data strobe clock signals. The electronic device also includes a digital block formed by a plurality of static storage elements (SSE) configured to capture read-back data received from the external memory over data lines when activated and configured to receive the one of the plurality of phase-delayed data strobe clock signals. The electronic device further includes a digital block demultiplexer configured to selectively activate static storage elements of the plurality of static storage elements to capture a portion of the received read-back data and a state machine. The state machine is configured to synchronize a first selection signal to the delay multiplexer and a second selection signal to the digital block demultiplexer to sequentially select a targeted pair of the plurality of static storage elements for each of the plurality of phase-delayed data strobe clock signals such that a portion of the received read-back data is captured by each targeted pair of the plurality of static storage elements in response to an associated one of the plurality of phase-delayed data strobe clock signals. The state machine is also configured to determine which of the plurality of phase-delayed data strobe clock signals resulted in known valid data being captured by the digital block based on a comparison of the portion of the received read-back data captured by each targeted pair of the plurality of static storage elements to the known valid data. The state machine is further configured to select one of the plurality of phase-delayed data strobe clock signals that resulted in valid data being captured as a read clock signal for the memory controller to capture read data from the external memory.

Another embodiment provides a method for adaptable phase training of high frequency clock signaling for data capture. The method includes generating, with a memory controller, a master clock signal and receiving, with an external memory, the master clock signal. The method also includes providing, with the external memory, a data strobe (DS) clock signal to the memory controller, the DS clock signal being a phase-delayed version of the master clock signal and receiving, with a plurality of cascaded delay elements, the data strobe clock signal. The method further includes generating, with the plurality of cascaded delay elements, a plurality of phase-delayed data strobe clock signals and receiving, with a delay multiplexer, the plurality of phase-delayed data strobe clock signals. The method also includes receiving, with a digital block formed by a plurality of static storage elements (SSE), read-back data received from the external memory over data lines and synchronizing, with a state machine, a first selection signal to the delay multiplexer and a second selection signal to a digital block demultiplexer to sequentially select a targeted pair of the plurality of static storage elements for each of the plurality of phase-delayed data strobe clock signals such that a portion of the received read-back data is captured by each targeted pair of the plurality of static storage elements in response to an associated one of the plurality of phase-delayed data strobe clock signals. The method further includes determining, with the state machine, which of the plurality of phase-delayed data strobe clock signals resulted in valid data being captured by the digital block based on a comparison of the portion of the received read-back data captured by each targeted pair of the plurality of static storage elements to known valid data and selecting, with the state machine, one of the plurality of phase-delayed data strobe clock signals that resulted in valid data being captured as a read clock signal for the memory controller to capture read data from the external memory.

Figure 3:
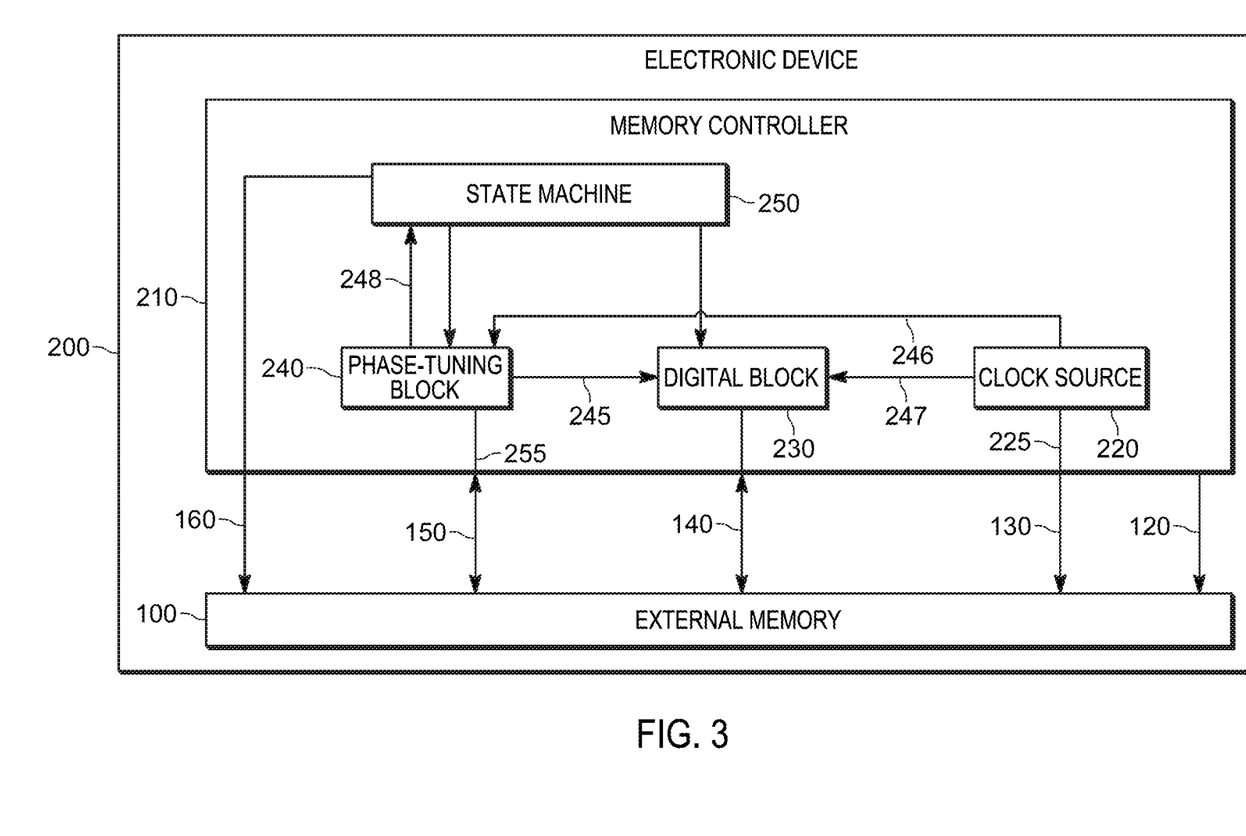
FIG. 3 is a block diagram of an electronic device including the external memory of FIG. 1 in accordance with some embodiments.

FIG. 3 is a block diagram of an electronic device 200 according to one example embodiment. In the example illustrated, the electronic device 200 includes the external memory 100 and a memory controller 210 to control the external memory 100. The memory controller 210 includes a clock source 220 that generates a master clock signal 225. The clock source 220 provides the master clock signal 225 as the host clock signal 130 (as shown in FIG. 1) to the external memory 100. The memory controller 210 also includes a digital block 230, a phase-tuning block 240, and a state machine 250. The electronic device 200 may include more or fewer components than those illustrated in FIG. 3 and may perform additional functions not described herein.

In some embodiments, the memory controller 210 is implemented as a microprocessor with separate memory. In other embodiments, the memory controller 210 is implemented as a microcontroller or digital signal processor (with embedded memory on the same chip or module). In other embodiments, the memory controller 210 is implemented using multiple processors. In addition, the memory controller 210 may be implemented partially or entirely as, for example, a field-programmable gate array (FPGA), an application specific integrated circuit (ASIC), and the like and a memory may not be needed or be modified accordingly.

The clock source 220 generates a digital block clock signal 247 that synchronizes the data transitions for digital block 230 such that the data signals over data lines 140 to the external memory 100 is synchronized to the master clock signal 225. In addition, the clock source 220 may provide an internal clock signal 246 to the phase-tuning block 240 which functions as the reference clock source that is deterministically correlated to a phase delayed clock signal (for example, a data capture clock signal 245). The internal clock signals 246 and 247 may not necessarily be the same as the master clock signal 225, and clocks 246 and 247 may not be equal to each other; however, the internal clock signals 246 and 247 are correlated to the master clock signal 225 such that a single period of the master clock signal 225 is equal to an integer number or periods of the internal clock signals 246 and 247. The memory controller 210 also manages a RWDS signal 255 corresponding to the RWDS signal 150 from FIG. 1, by appropriately configuring the internal blocks as necessary to support the different functions of the RWDS signal 150 for different read or write operations to the external memory 100. Specifically, the memory controller 210 configures internal blocks of the memory controller 210 to facilitate the data mask function of the RWDS signal 150 during write operations, or alternatively, to facilitate a strobe cock function during data read operations to and from the external memory 100.

The digital block 230 may generate data to be written over data lines 140 to the external memory 100 when in a write mode and may also capture data received over data lines 140 from the external memory 100. The phase-tuning block 240 uses a received RWDS signal 150 (for example, the data strobe clock signal) during a read operation to generate a data capture clock signal 245. The received RWDS signal 150 is appropriately phase delayed to generate the data capture clock signal 245 that is subsequently used to capture data received on data lines 140 from the external memory 100 to the digital block 230. Alternatively, the phase-tuning block 240 may also use the internal clock signal 246 to generate a different data capture clock signal 245, where the internal clock signal 246 is appropriately phase delayed to capture data received on data lines 140 from the external memory 100 during the read operations. A clock period of the RWDS signal 150 is equal to integer multiples of the internal clock signal 246 periods, where the internal clock signal 246 is an integer multiple of the master clock signal 225 and the RWDS signal 150 is equal in period to the master clock signal 225. The transitions of the RWDS signal 150 are synchronous to, and in phase with, transitions of read-back data signals provided by the external memory 100 to the memory controller 210 on data lines 140. Therefore, given that the RWDS signal 150 transitions are synchronous to the data signals on data lines 140, the data capture clock signal 245 generated from the internal clock signal 246 exhibits multiple clock transitions between data logic transitions on the data lines 140. Accordingly, the amount of phase adjustment at the phase-tuning block 240 to facilitate proper data capture varies depending on whether the RWDS signal 150 or the internal clock signal 246 is used to generate the data capture clock signal 245. The state machine 250 receives an input source clock signal 248 from the phase-tuning block 240 where the input source clock signal 248 is a clock signal used to generate the data capture clock signal 245. The input source clock signal 248 is the reference clock for the state machine 250, which in turn controls the digital block 230, the phase-tuning block 240, and the cascaded delay elements 350, as further described below. In some embodiments, the digital block 230, the phase-tuning block 240, and the state machine 250 may not be part of the memory controller 210 and may be provided outside the memory controller 210. In these embodiments, the memory controller 210 forwards the data lines 140 and the RWDS signal 150 to the digital block 230, the phase-tuning block 240, and the state machine 250.

Figure 4:
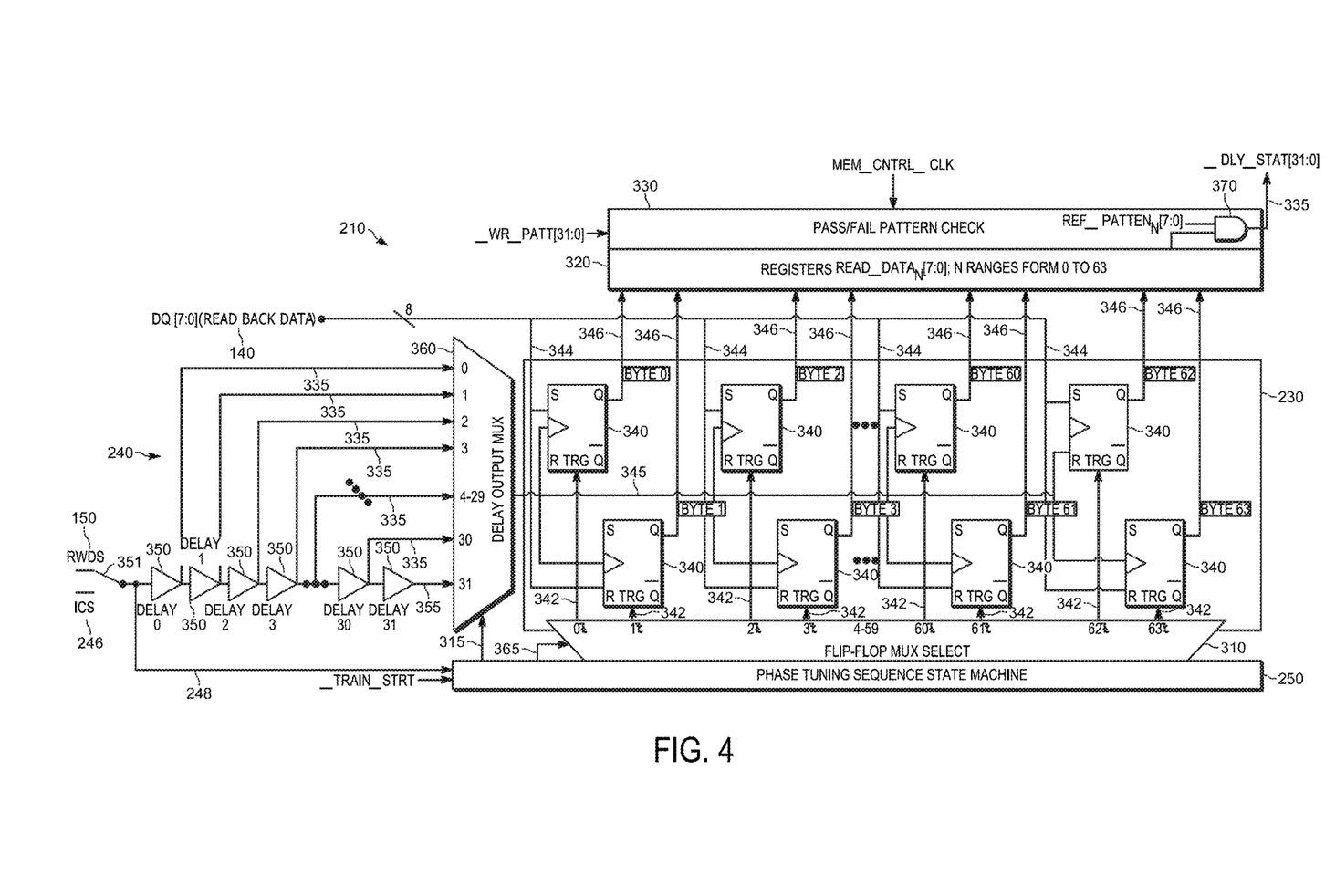
FIG. 4 is a block diagram of a memory controller of the electronic device of FIG. 3 in accordance with some embodiments.

FIG. 4 is a block diagram of the memory controller 210 according to one example embodiment. As described above, the memory controller 210 includes the digital block 230, the phase-tuning block 240, and the state machine 250. Additionally, the memory controller 210 includes a digital block demultiplexer 310, a plurality of registers 320, and a pass/fail pattern check circuit 330. The digital block 230 is formed by a plurality of static storage elements 340. The plurality of static storage elements 340 may be latches, flip-flops, registers, or the like. The plurality of static storage elements 340 receive a trigger enable signal 342 from the digital block demultiplexer 310 and receive the data capture clock signal 245 from the phase-tuning block 240. The plurality of static storage elements 340 receive data input 344 from the data lines 140 and provide the data received from the data lines 140 as data output 346 to the plurality of registers 320. The plurality of static storage elements 340 are arranged in pairs such that each static storage element 340 of a pair of static storage elements 340 are enabled to capture data with a particular clock edge of the data capture clock signal 245. The data capture clock signal 245 is generated by the phase-tuning block 240 using the input source clock signal 248 that is adjustable through a switch 351. The switch 351 is used to select between the RWDS signal 150 or the internal clock signal 246 as the input source clock signal 248. The RWDS signal 150 may be selected as the input source clock signal 248 when the master clock signal 225 is operating at substantially high frequencies closer to the device fabrication process limits. The internal clock signal 246 may be selected as the input source clock signal 248 when the master clock signal 225 is operating at lower frequencies that allow integer-N multiples of the master clock signal 225 to be processed by the phase-tuning block 240, and thereby afford greater granularity in the phase adjustment control at the state machine 250.

In one embodiment where the RWDS signal 150 is selected as the input source clock signal 248, a first static storage element 340 of a pair of static storage elements 340 captures data on a rising clock edge of the data capture clock signal 245 and a second static storage element 340 of the pair of static storage elements 340 captures data on the subsequent falling clock edge of the data capture clock signal 245. In this embodiments, the clock period of the RWDS signal 150 is equal to the clock period of the master clock signal 225. Therefore, the read-back data is captured every half clock cycle when operating in the double data rate (DDR) mode.

In another embodiment where the internal clock signal 246 is selected as the input source clock signal 248 and the frequency of the internal clock signal 246 is equal to an integer-N multiple of the frequency of the master clock signal 225, a first static storage element 340 of a pair of static storage elements 340 captures data on a rising clock edge of the data capture clock signal 245 that is also synchronous to the rising clock edge of the RWDS signal 150. However, a second static storage element 340 of the pair of static storage elements 340 captures data on an appropriate rising or falling clock edge (that is, a rising edge when the integer-N multiple is an even number, and a falling edge when the integer-N multiple is an odd number) as related to the frequency multiple N of the internal clock signal 246. When the frequency multiple N of the internal clock signal 246 is an even integer, then the second static storage element 340 of the pair of static storage elements 340 captures data on a rising edge that is N/2 periods of the internal clock signal 246 following the data capture by the first static storage element 340. Accordingly, for an internal clock signal 246 that is four times faster than the master clock signal 225, the second static storage element 340 captures data on the rising edge of the data capture clock signal 245 that is two clock periods (that is, 4/2=2 periods) after the rising clock edge used to capture data by the first static storage element 340. In other words, the data signal transitions on the data lines 140 that correspond to the rising and falling edge of the RWDS signal 150, occur every two periods of the internal clock signal 246 when the internal clock signal 246 is 4 times faster than the master clock signal 225. Alternatively, when the frequency multiple N for the internal clock signal 246 is an odd integer, the second static storage element 340 of the pair of static storage elements 340 captures data on a falling edge that is FLOOR(N/2) clock periods following the data capture by the first static storage element 340. The FLOOR( ) function is the rounded down integer value of (N/2). Accordingly, for an internal clock signal 246 that is three times faster than the master clock signal 225, the second static storage element 340 captures data on the first falling edge of the data capture clock signal 245 after one full clock period (that is, FLOOR(3/2)=1 period) after the rising clock edge used to capture data by the first static storage element 340. In other words, the read-back data signal transitions on the data lines 140 that correspond to the rising and falling edges of the RWDS signal 150 occur every one and one-half periods of the internal clock signal 246 when the internal clock signal 246 is three times faster than the master clock signal 225. Stated another way, the falling edge of the RWDS signal 150 aligns with the first falling edge of the internal clock signal 246 that is one clock period after the rising edge of the internal clock signal 246 that corresponds to the rising edge of the RWDS signal 150 for an internal clock signal 246 that is three times faster than the master clock signal 225. The selection of the appropriate clock edge from the data capture clock signal 245 on which to capture the received read-back data on the data lines 140 and the number of clock periods separating the clock edges between successive data captures, as described above, is controlled by the state machine 250 through trigger enable signals 342 using the input source clock signal 248 in conjunction with a priori knowledge of the relationship between the input source clock signal 248 relative to the master clock signal 225.

The digital block demultiplexer 310 receives a second selection signal 365 from the state machine 250 to selectively activate one pair of the plurality of static storage elements 340. The digital block demultiplexer 310 provides trigger enable signals 342 to each of the individual static storage elements 340 within a selected pair of the static storage elements 340 to capture the read-back data on the data lines 140. In the example illustrated in FIG. 4, the digital block 230 includes "64" static storage elements 340, forming "32 pairs" of static storage elements 340, each pair of static storage elements 340 are independently selected by the second selection signal 365. The digital block demultiplexer 310 provides "32" pairs of trigger enable signals 342—each trigger enable signal 342 forming a pair of trigger enable signals 342 is independently enabled proximate to the clock trigger edge corresponding to proper capture of read back data on the data lines 140. Each pair of static storage elements 340 correspond to one of a plurality of phase-delayed data strobe clock signals 355. The digital block demultiplexer 310 receives the second selection signal 365 from the state machine 250 to activate one of "32" paired trigger enable signals 342 such that only one pair of static storage elements 340 is activated for each selection of the plurality of phase-delayed data strobe clock signals 355. That is, the digital block demultiplexer 310 selectively activates static storage elements 340 of the plurality of static storage elements 340 to capture a portion of the received read-back data. It should be appreciated that the present example describes "32" pairs of static storage elements 340, controlled by "32" pairs of trigger enable signals 342, corresponding to "32" phase delay elements 355, the number of phase delay elements 355 implemented in a particular design may be greater than, or less than "32", and the corresponding number of the paired static storage elements 340 may be increased or reduced accordingly, without departing from the scope of the invention described herein.

The phase-tuning block 240 includes a plurality of cascaded delay elements 350 and a delay multiplexer 360. The plurality of cascaded delay elements 350 receive the input source clock signal 248 from the switch 351 and generate a plurality of phase-delayed data strobe clock signals 355. In one example, the plurality of phase-delayed data strobe clock signals 355 are each incrementally phase-delayed such that a first phase-delayed data strobe clock signal 355 has a smaller phase delay than a second phase-delayed data strobe clock signal 355, which has a smaller phase delay than a third phase-delayed data strobe clock signal 355. The number of delay elements 350 are typically equal to the number of paired static storage elements 340. In the example illustrated, a first delay element 350 of the plurality of cascaded delay elements 350 receives the input source clock signal 248 and adds a first phase-delay to the input source clock signal 248 to generate a first phase-delayed data strobe clock signal 355. A second delay element 350 of the plurality of cascaded delay elements 350 receives the first phase-delayed data strobe clock signal 355 from the first delay element 350 and adds a second-phase delay to the first phase-delayed data strobe clock signal 355 to generate a second phase-delayed data strobe clock signal 355 and so on. In some embodiments, the first phase-delay may be equal to the second phase-delay and so on. In other embodiments, each phase-delay introduced by the plurality of cascaded delay elements 350 may have a different value.

The delay multiplexer 360 receives the plurality of phase-delayed data strobe clock signals 355 from the plurality of cascaded delay elements 350 and outputs one of the plurality of phase-delayed data strobe clock signals 355 as the data capture clock signal 245. The delay multiplexer 360 receives a first selection signal 315 from the state machine 250 to select one of the plurality of phase-delayed data strobe clock signals 355 as the data capture clock signal 245. The digital block 230 receives the one of the plurality of phase-delayed data strobe clock signals 355 as the data capture clock signal 245.

In some embodiments, the state machine 250 includes a series of computer instructions stored in a memory of the memory controller 210 and executed by an electronic processor of the memory controller 210. In other embodiments, the state machine 250 is a dedicated hardware state machine separate from the memory controller 210. The state machine 250 receives the input source clock signal 248 and determines when data is set to arrive over the data lines 140 based on the latency count asserted by the external memory 100 over the RWDS signal 150, as indicated by the host clock signal 130 cycle count. As discussed above, the state machine 250 provides the second selection signal 365 to the digital block demultiplexer 310 and the first selection signal 315 to the delay multiplexer 360.

The plurality of registers 320 store a portion of the read data over data lines 140 that is captured by the plurality of static storage elements 340 using the data output 346. The pass/fail pattern check circuit 330 compares the data stored in the plurality of registers 320 to known valid data and outputs a validity signal 335 that indicates which parts of the stored data matches the known valid data. The pass/fail pattern check circuit 330 includes a comparator 370 that receives the stored data in the plurality of registers 320, each register 320 of the plurality of registers 320 corresponding to segments of captured data taken from different static storage elements 340. The comparator 370 also receives the known valid data as a reference for comparison to the appropriate segment as inputs. The known valid data this is used as a reference into comparator 370 is contained in the write pattern WR_PATT[31:0]. The comparator 370 outputs the validity signal 335, known as the delay status signal DLY_STATUS [31:0], based on comparing the captured data to the known valid data. In some embodiments, pass/fail pattern check circuit 330 is part of the state machine 250 and is controlled by the state machine 250. The state machine 250 receives the validity signal 335 from the pass/fail pattern check circuit 330.

As discussed above with respect to FIG. 2, the rising and falling edges of the master clock signal 225 have the phase delay 154 with respect to the data assertions on the data lines 140 and the rising and falling edges of the RWDS signal 150. Due to this phase delay 154, capturing data on the data lines 140 based on the edges of the master clock signal 225 would be mistimed with the data assertions on the data lines 140 and would result in capturing incorrect data. Additionally, the phase delay 154 between the master clock signal 225 and the RWDS signal 150 may change over the operating period of the electronic device 200. The state machine 250 performs phase training, also referred to as phase tuning, to determine and select the appropriate phase-delayed data strobe clock signal 355 that results in proper data capture from the external memory 100.

Figure 5:
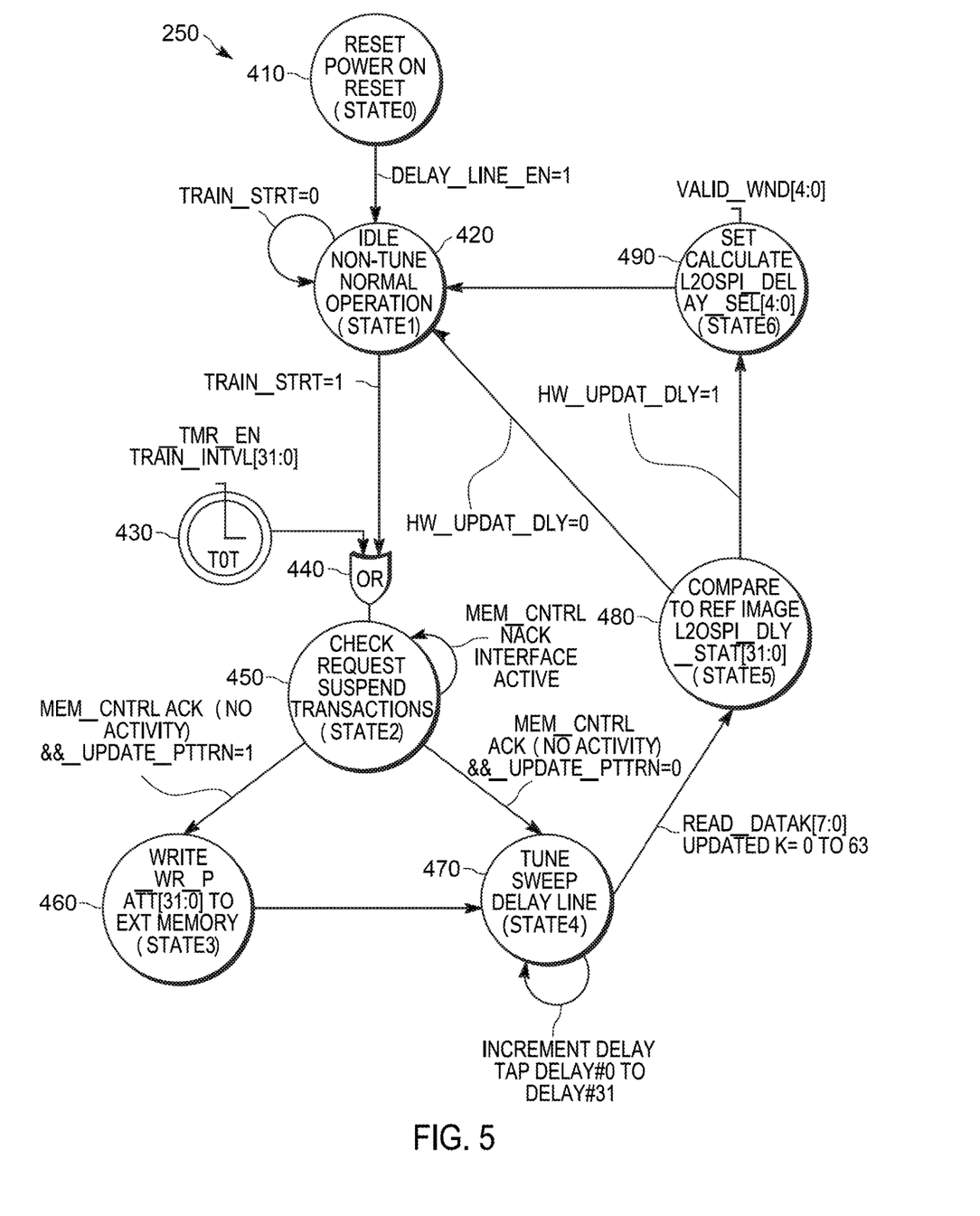
FIG. 5 is a state diagram of one example method for adaptable phase training implemented by the memory controller of FIG. 4 in accordance with some embodiments.

FIG. 5 illustrates an example state machine 250 for adaptable phase training of high frequency clock signaling for data capture. In the example illustrated, the state machine 250 is in a RESET state 410 when the electronic device 200 is initiated. The state machine 250 enters the IDLE state 420 when a DELAY_LINE_EN is set to HIGH.

In the IDLE state 420, the electronic device 200 is operating normally and captures data from the external memory 100 using a previously phase-trained clock signal fed to the plurality of static storage elements 340. The state machine 250 remains in the IDLE state 420 until the training start signal TRAIN_STRT is set to high or a time-out timer 430 lapses. The memory controller 210 may set the TRAIN_STRT signal to HIGH when the memory controller 210 determines, for example, that a previously phase-trained clock signal has become out-of-synch with the data assertions on the data lines 140. The time-out timer 430 may be set at one of various time levels (for example, one, two, or three minutes), which may be selected based on characteristics of the electronic device 200 or the operating environment of the electronic device 200. When the time-out timer 430 expires, the time-out timer 430 outputs a HIGH signal and resets. The TRAIN_START signal and the output of the time-out timer 430 are provided to an OR gate 440. The OR gate 440 outputs a HIGH signal when either the output of the time-out timer 430 or the TRAIN_START signal is set to HIGH, or when both the output of the time-out timer 430 and the TRAIN_START signal are set to HIGH.

The state machine 250 enters the CHECK REQUEST state 450 when the output of the OR gate 40 is HIGH. In the CHECK REQUEST state 450, the state machine 250 first checks for ongoing transactions with the external memory 100, based on a mem_cntrl signaling between the memory controller 210 and the electronic device main bus (not shown). The state machine 250 first checks whether there is an active memory transaction by querying the mem_cntrl signal between the memory controller 210 and the electronic device main bus. The state machine 250 remains in the CHECK REQUEST state 450 when the state machine 250 receives a negative acknowledgement NACK from the mem_cntrl signal. The negative acknowledgement NACK indicates that there is an ongoing active transaction to the external memory 100. Upon termination of an active transaction, the state machine 250 receives an acknowledgement ACK from the mem_cntrl signal. The state machine 250 enters one of the WRITE state 460 and the TUNE state 470 when the state machine 250 receives the acknowledgment ACK from the mem_cntrl signal.

The state machine 250 enters the WRITE state 460 when the state machine 250 receives an acknowledgement ACK from the external memory 100 and the UPDATE_PTTRN is set to HIGH. In the WRITE state 460, the state machine 250 writes a new reference pattern WR_PATT[31:0] (that is, the known valid data) to the external memory 100. This WR_PATT[31:0] is used to verify the accuracy of the captured data from the plurality of static storage elements 340 as a function of different phase-delayed data strobe clock signals 355, as is described in further detail below. WR_PATT[31:0] may be a full image of the reference pattern or a portion of the full reference pattern. When the WR_PATT[31:0] is a portion of the full image, the entire reference pattern may be generated by repeating WR_PATT [31:0] multiple times. In other words, when the full readback reference pattern used in the pass/fail pattern check circuit 330 is "64" bytes in length, the full reference pattern is derived by repeating the "4" bytes defined in WR_PATT [31:0] sixteen times.

The state machine 250 enters the TUNE state 470 after writing the new reference pattern in the WRITE state 460 or after the state machine 250, while in the CHECK REQUEST state 450, receives an acknowledgement ACK from the mem_cntrl signal and the UPDATE_PTTRN is set to LOW. In the TUNE state 470, the state machine 250 sequentially steps through the plurality of cascaded delay elements 350 to generate a series of phase-delayed data strobe clock signals 355 as the data capture clock signal 245. Each iteration of the data capture clock signal 245 is used on a particular pair of static storage elements 340 to capture a portion of the data READ_DATA[7:0] (that is, READ_DATA[7:0] corresponds to the captured data from a portion of the read back data DQ[7:0] over the data lines 140 in FIG. 4) from the external memory 100. When the test data corresponding to the plurality of cascaded delay elements 350 is captured, the state machine 250 enters the COMPARE state 480.

In the COMPARE state 480, the state machine 250 compares the appropriate portion of the captured data READ_DATA[7:0] in plurality of registers 320 corresponding to each of the plurality of cascaded delay elements 350 to a reference pattern, for example, the reference pattern WR_PATT[31:0] written to the external memory 100 in the WRITE state 460. The state machine 250 determines for which of the plurality of cascaded delay elements 350, the captured test data READ_DATA[7:0] matches the reference pattern in the pass/fail pattern check circuit 330. In the example illustrated, the plurality of registers 320 include "64" registers 320, each register corresponding to one of the plurality of static storage elements 340, the "64" static storage elements 340 being arranged to form "32" pairs of static storage elements 340, each pair of static storage elements corresponding to one of the "32" delay elements 350. In other words, for each of the "32" delay elements 350, there is a corresponding pair of static storage elements 340, each individual static storage element 340 having a dedicated register within the plurality of "64" registers 320. In the COMPARE state 480, the pass/fail pattern check circuit 330 compares the captured data READ_DATA[7:0] for each of the plurality of registers 320 to a corresponding known reference patter WR_PATT[31:0] to determine whether a valid read had occurred. Since each of the plurality of registers 320 are associated with a particular delay element 350, then the state machine 250 may determine which delay elements 350 within the plurality of delay elements 350 results in valid data being captured by determining which register 320 matches the corresponding reference pattern WR_PATT[31:0]. The output of the pass/fail pattern check circuit 330 is a "32" bit delay status word DLY_STAT[31:0], where each but position in DLY_STAT[31:0] corresponds to a particular delay element 350. When a valid read has occurred for one of the "32" delay elements 350, the appropriate bit in DLY_STAT[31:0] is set to logic HIGH. When a valid read has not occurred for one of the "32" delay elements 350, the appropriate bit in DLY_STAT[31:0] is set to logic LOW. Although the example illustrates "32" delay elements 350, "32" pairs of static storage elements 340, and "64" registers 320, one of ordinary skill in the art can appreciate that any number of delay elements 350, static storage elements 340, and registers 320 may be used based on the desired phase-delay tune precision.

From the COMPARE state 480, the state machine 250 enters the SET state 490 when the HW_UPDAT_DLY signal is set to HIGH. In the SET state 490, the state machine 250 processes the delay status work DLY_STAT[31:0] to select one of the phase-delayed data strobe clock signals 355 as the data capture clock signal 245 for the plurality of static storage elements 340. The selected phase-delayed data strobe clock signal 355 becomes a read clock signal by which subsequent read-back data signals over the data lines 140 are captured when reading data from the external memory 100. From the SET state 490, the state machine 250 enters the IDLE state 420 to perform normal transactions (for example, read and write operations) between the memory controller 210 and the external memory 100. In some embodiments, the delay status work DLY_STAT[31:0] may be processed by a separate processor (that is, not the state machine 250) and the appropriate phase-delayed data strobe clock signal 355 may be selected from the plurality of the phase-delayed data strobe clock signals 355 by a supervisory processing architecture (not shown).

The HW_UPDAT_DLY signal is set to LOW in the COMPARE state 480 and the state machine 250 returns to the IDLE state 420 (bypassing the SET state 490) to perform normal transactions (for example, read and write operations) between the memory controller 210 and the external memory 100 using a previously set data capture clock signal 245.

Figure 6:
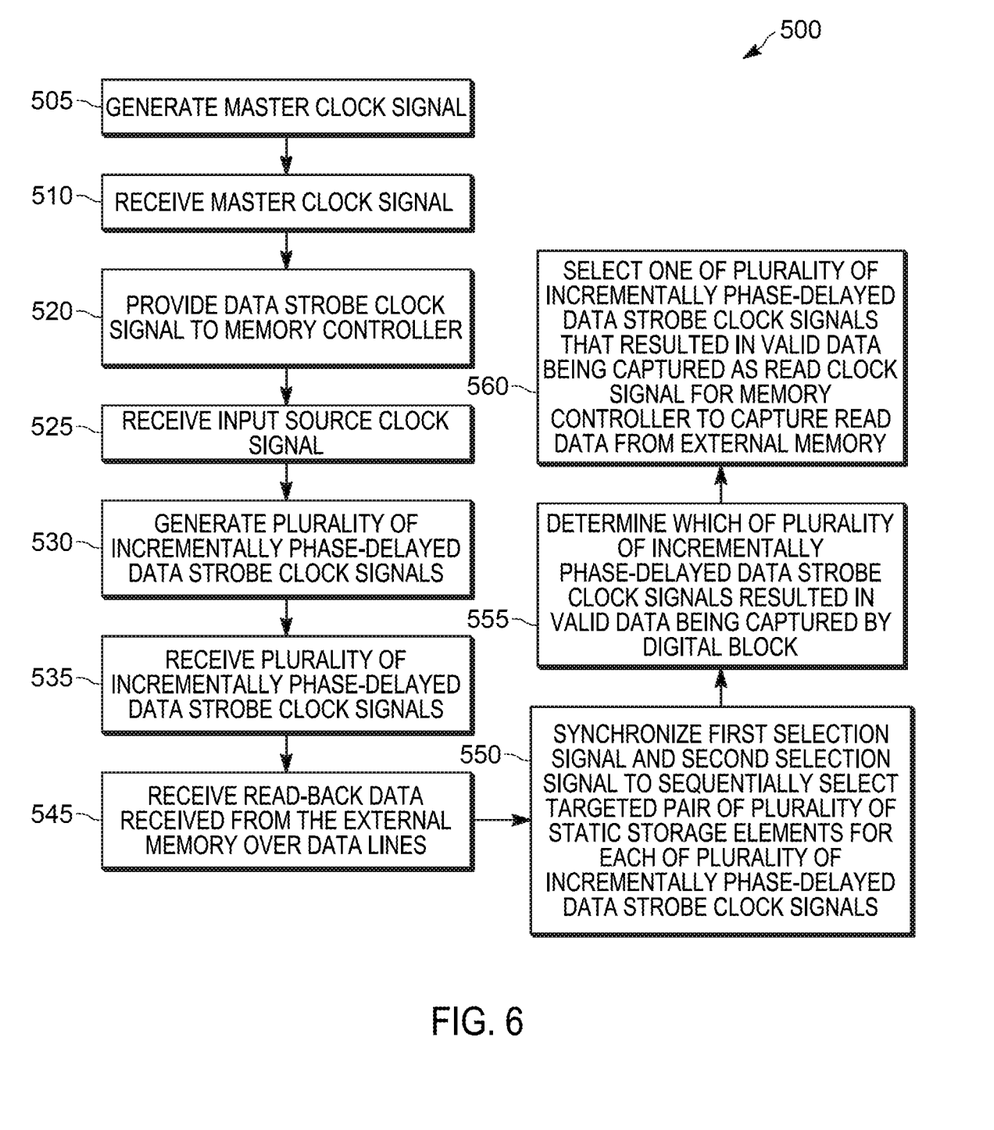
FIG. 6 is a flowchart of one example method for adaptable phase training implemented in accordance with some embodiments.

FIG. 6 illustrates a flowchart of an example method 500 for adaptable phase training of high frequency clock signaling for data capture. In the example illustrated, the method 500 includes generating, with the memory controller 210, a master clock signal 225 (at block 505). The memory controller 210 generates the master clock signal 225 using the clock source 220 and provides the master clock signal 225 as the host clock signal 130 to the external memory 100.

The method 500 also includes receiving, with the external memory 100, the master clock signal 225 (at block 510). The external memory 100 receives the master clock signal 225 as the host clock signal 130. In some embodiments, the method 500 further includes operating the external memory 100 in a double data rate (DDR) mode. Operating the external memory 100 in a double data rate mode includes, in response to a read command, the external memory 100 providing a new byte of data on the data lines 140 at the rising clock edge and the falling clock edge of the RWDS signal 150 (see, e.g., FIG. 2). The method 500 also includes providing, with the external memory 100, a data strobe (DS) clock signal to the memory controller 210 (at block 520). The phase-delayed clock signal 152 (FIG. 2) is provided as the RWDS signal 150 (for example, data strobe clock signal) to the memory controller 210 when the data is available over the data lines 140.

The method 500 further includes receiving, with the plurality of cascaded delay elements 350, the input source clock signal 248 (at block 525). The memory controller 210 provides the RWDS signal 150 (that is, the data strobe clock signal) to the switch 351. The state machine 250 controls the switch to select between the RWDS signal 150 or the internal clock signal 246 as the input source clock signal 248. As discussed above, the frequency (for example, a first frequency) of the internal clock signal 246 is an integer multiple of the frequency (for example, a second frequency) of the RWDS signal 150. The output of the switch 351 is the input source clock signal 248 that drives the plurality of cascaded delay elements 350. The state machine 250 selects the internal clock signal 246 as the input source clock signal 248 when a higher frequency strobe is desirable. The higher frequency strobe provides greater precision in the phase delay increments during the read-back phase tune process. Because the internal clock signal 246 is deterministically related to master clock signal 225, and is a phase delayed version of master clock signal 225, the state machine 250 can determine which edge of the internal clock signal 246 corresponds to the double data rate capture following a known latency count (as discussed above with respect to FIG. 2).

The method 500 also includes generating, with the plurality of cascaded delay elements 350, the plurality of phase-delayed data strobe clock signals 355 (at block 530) from the input source clock signal 248. As discussed above, the plurality of cascaded delay elements 350 receive the input source clock signal 248 and generate a plurality of phase-delayed data strobe clock signals 355. For example, a first delay element 350 of the plurality of cascaded delay elements 350 receives the input source clock signal 248 and adds a first phase-delay to the input source clock signal 248 to generate a first phase-delayed data strobe clock signal 355. A second delay element 350 of the plurality of cascaded delay elements 350 receives the first phase-delayed data strobe clock signal 355 from the first delay element 350 and adds a second-phase delay to the first phase-delayed data strobe clock signal 355 to generate a second phase-delayed data strobe clock signal 355 and so on.

The method 500 also includes receiving, with the delay multiplexer 360, the plurality of phase-delayed data strobe clock signals 355 (at block 535). The plurality of phase-delayed data strobe clock signals 355 generated by the cascaded delay elements 350 are provided to the delay multiplexer 360 in the phase-tuning block 240.

The method 500 includes selecting one of the plurality of phase-delayed data strobe clock signals 355 with the delay multiplexer 360. The delay multiplexer 360 outputs the one of the plurality of phase-delayed data strobe clock signals 355 as the data capture clock signal 245 to the plurality of static storage elements 340. The delay multiplexer 360 sequences through each of the plurality of phase-delayed data strobe clock signal 355, where each of the plurality of phase-delayed data strobe clock signals 355 is selected for a portion of the read-back data signals on the data lines 140. In particular, the state machine 250 provides the first selection signal 315 to the delay multiplexer 360 to select the one of the plurality of phase-delayed data strobe clock signals 355 as the data capture clock signal 245 for a first portion of the read back data over the data lines 140. The state machine 250 subsequently updates the first selection signal 315 to the delay multiplexer 360 to select a subsequent phase-delayed data strobe clock signal 355 from the plurality of phase-delayed data strobe clock signals 355. The selected phase-delayed data strobe clock signal 355 becomes an updated data capture clock signal 245 for a second portion of read-back data over the data lines 140. This process is repeated until all the plurality of phase-delayed data strobe clock signal 355 have been cycled through the delay multiplexer 360 to adjust the data capture clock signal 245 for capturing sequential portions of the read-back data over the data lines 140.

The method 500 also includes receiving, with the digital block 230 formed by the plurality of static storage elements 340, read-back data from the external memory 100 over data lines 140 (at block 545). The data lines 140 are provided to each of the plurality of static storage elements 340 such that when activated, the plurality of static storage elements 340 capture the data asserted over the data lines 140. As discussed above, the plurality of static storage elements 340 are arranged in pairs such that a first static storage element 340 of a pair of static storage elements 340 captures data on a rising clock edge of the data capture clock signal 245 and a second static storage element 340 of the pair of static storage elements 340 captures data on an appropriate rising or falling clock edge of the data capture clock signal 245. As discussed above, the rising or falling edge for data capture depends on whether the RWDS signal 150 or the internal clock signal 246 is selected as the input source clock signal 248 and what integer N relationship exists between the internal clock signal 246 and the RWDS signal 150.

The method 500 also includes synchronizing, with the state machine 250, the first selection signal 315 to the delay multiplexer 360 and the second selection signal 365 to the digital block demultiplexer 310 to sequentially select a targeted pair of the plurality of static storage elements 340 for each of the plurality of phase-delayed data strobe clock signals 355 such that a portion of the received read-back data is captured by each targeted pair of the plurality of static storage elements 340 in response to an associated one of the phase-delayed data strobe clock signals 355 (at block 550). The state machine 250 sequentially selects each one of the plurality of phase-delayed data strobe clock signals 355 using the first selection signal 315. Synchronous with the first selection signal 315, the state machine 250 sequentially activates pairs of static storage elements 340 using the second selection signal 365. The activated pair of the static storage elements 340 correspond to one of the plurality of phase-delayed data strobe clock signals 355. The digital block 230 stores two bytes of data read back from the external memory 100 over the data lines 140 for each one of the plurality of phase-delayed data strobe clock signals 355. The selected pair of static storage elements 340 captures two bytes of read-back data (that is, one byte for each static storage element 340 forming the pair of static storage elements 340) based on an appropriate clock edge of the data capture clock signal 245 after the individual static storage elements 340 have been pre-triggered using the trigger enable signal 342. For example, a first pair of static storage elements 340 is activated in tandem with selecting a first phase-delayed data strobe clock signal 355. A first static storage element 340 of the first pair of static storage elements 340 is pre-triggered using the trigger enable signal 342 (for example, a first trigger enable signal 342) to enable capture of a first byte of read-back data from the external memory 100 on the rising clock edge of the data capture clock signal 245 provided to the delay multiplexer 360. Subsequent to the capture of the first byte of read back data, a second static storage element 340 of the selected pair of static storage elements 340 is pre-triggered by a separate trigger enable signal 342 (for example, a second trigger enable signal 342 different from the first trigger enable signal 342) to capture a second byte of read-back data from the external memory 100 on an appropriate rising or falling edge of the data capture clock signal 245 depending on the selection at switch 351. The timing of the trigger enable signals 342 determines which edge of the data capture clock signal 245 is used to capture data over the data lines 140. The timing of the trigger enable signals 342 is based on prior knowledge of the relationship between RWDS signal 150 and the internal clock signal 246 and the clock edge counter configuration within the state machine 250 in relation to the input source clock signal 248.

The method 500 further includes determining, with the state machine 250, which of the plurality of phase-delayed data strobe clock signals 355 resulted in known valid data being captured by the digital block 230 based on a comparison of the portion of the received read-back data captured by each targeted pair of the plurality of static storage elements 340 to known valid data (at block 555). The comparator 370 compares each segment of the read-back data to an appropriate segment of known valid data as determined by the reference pattern WR_PATT[31:0]. As discussed above, each segment of the read back data is captured for a different one of the plurality of phase-delayed data strobe clock signal 355. The comparison is made for each one of the plurality of phase-delayed data strobe clock signals 355. As discussed above, the output of the comparator 370 is a delay status signal DLY_STAT[31:0] (that is, the validity signal 335). Each bit position in the delay status signal DLY_STAT[31:0] corresponds to a particular delay element 350. The state machine 250 determines which one of the plurality of phase-delayed data strobe clock signals 355 resulted in valid data being captured by a given pair of the plurality of static storage elements 340 based on the delay status signal DLY_STAT[31:0].

The method 500 also includes selecting, with the state machine 250, one of the plurality of phase-delayed data strobe clock signals 355 that resulted in valid data being captured as a read clock signal for the memory controller 210 to capture read data from the external memory 100 (at block 560). The state machine 250 may determine that a range of the delay elements 350 generate the plurality of phase-delayed data strobe clock signals 355 that result in valid data being captured by the digital block 230. In one embodiment, the state machine 250 selects a mid-point of the range of the plurality of phase-delayed data strobe clock signals 355 as the read clock signal for the memory controller 210. The mid-point of the range is determined by determining a bit-position of a mid-point of a range of continuous logic HIGHS in the delay status word DLY_STAT[31:0]. The middle bit position in the range of logic HIGHS in the delay status word DLY_STAT[31:] corresponds to a particular delay element 350, which is selected to generate a phase-delayed data strobe clock signal 355 (that is, the read clock signal) for subsequent data capture from the external memory 100. In other embodiments, the state machine 250 may use one of the endpoints or another point in the range of the plurality of phase-delayed data strobe clock signals 355 as the read clock signal for the memory controller 210. The selected delay element 350 corresponds to a logic HIGH in the delay status word DLY_STAT[31:0].

The memory controller 210 uses the read clock signal as the clock signal for capturing subsequent data received from the external memory 100 during read transactions with the external memory 100. For example, the memory controller 210 provides a command address over the data lines 140 to the external memory 100 including a read command and an address indicating the cells of the memory cells 180 to be read. In response, the external memory 100 provides the data from the addressed cells (the read data) over the data lines 140 to the memory controller 210, edge-aligned with the RWDS signal 150 (see, e.g., FIG. 2). The read data is captured by static storage elements 340 of the memory controller 210 (for example, the static storage elements 340 or other static storage elements) using the read clock signal selected in block 575 to trigger data capture by the static storage elements 340.

In some embodiments, to select one of the plurality of phase-delayed data strobe clock signals 355 that resulted in known valid data being captured as a read clock signal for the memory controller 210, the state machine 250 first processes the delay status word DLY_STAT[31:0] using different techniques, for example, determining a valid window of the plurality of phase-delayed data strobe clock signals 355. For example, the state machine 250 may parse the delay status word DLY_STAT[31:0] to determine the upper and lower boundary of a range of logic HIGHs (shown in FIG. 7).

Figure 7:
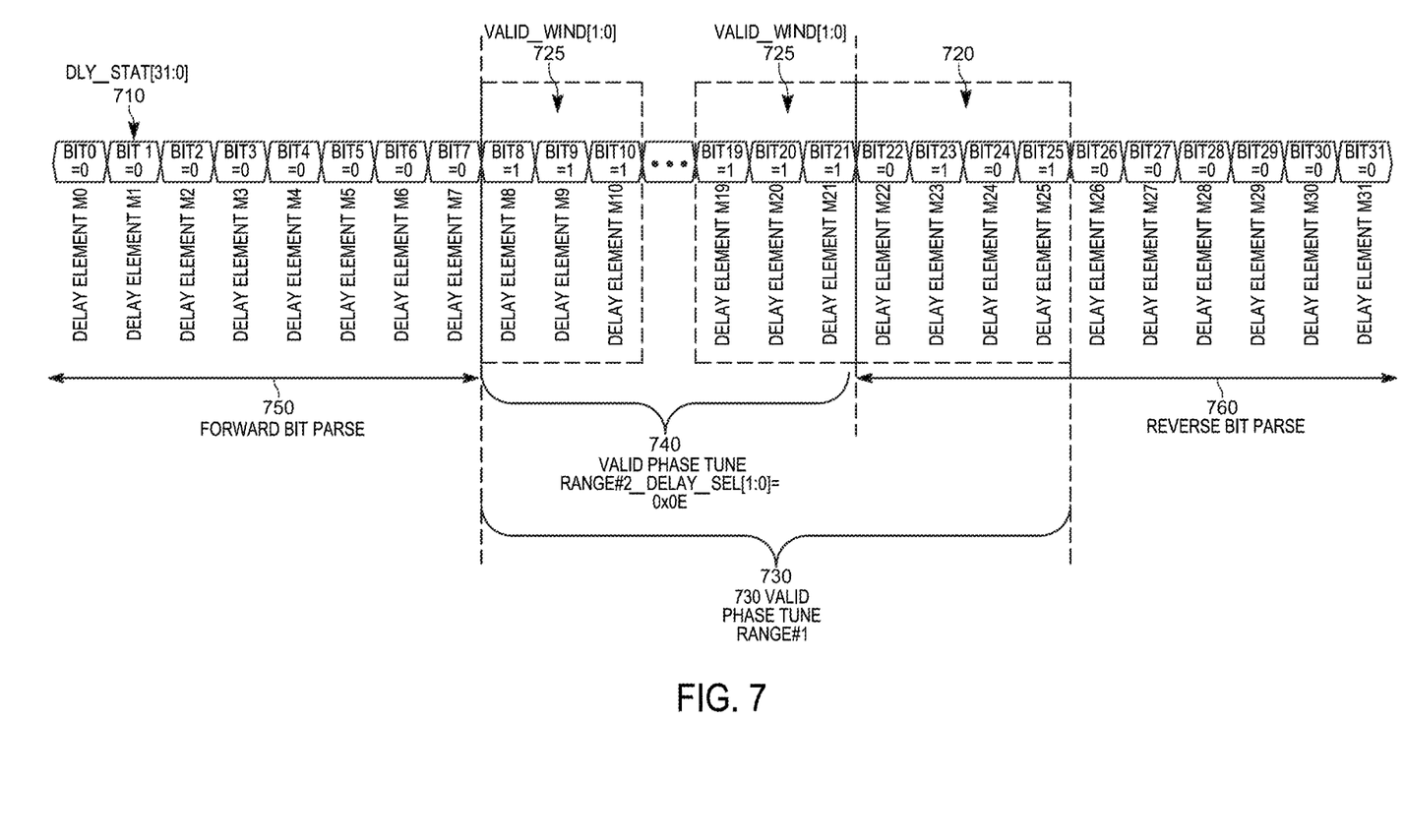
FIG. 7 illustrates an example of a valid window of phase-delays resulting in capture of known valid data by the memory controller of FIG. 4.

Referring to FIG. 7, the state machine 250 performs a forward parse 750 of but values in register DLY_STAT[31:0] 710 to determine the first bit position that contains a logic HIGH—corresponding to the first one of the plurality of phase-delayed data strobe clock signals 355 that captured the known valid data. The forward parse search is a sequential iteration that begins at the Least Significant Bit (LSB) position and sequentially searches in ascending bit position order until it finds the first logic HIGH. The state machine 250 also performs a reverse parse 760 of bit values in register DLY_STAT[31:0] 710 to determine the last bit position in the register containing a logic LOW—corresponding to the last one of the plurality of phase-delayed data strobe clock signals 355 that captured the known valid data. The reverse parse search is a sequential iteration that begins at the Most Significant Bit (MSB) position and sequentially searches in descending bit position order until it finds the first logic HIGH. By determining the first bit position and the last bit position containing a logic HIGH, the state machine 250 determines a valid phase tune bit range (for example, valid phase tune range #1 730). The bits between the first bit position and the last bit position containing a logic HIGH are the "valid data" range from which the middle-point bit position determination is made as described above.

In some embodiments, the state machine 250 may check for continuous logic HIGH states over a set number of subsequent bits to ensure that each subsequent bit in the sequent is still a logic HIGH, for example, as defined in VALID_WIND[4:0] 725 following the first logic HIGH encountered during a bit parse. For example, when the VALID_WIND[4:0] is set to "3", the state machine 250 checks for three contiguous logic HIGHs in the subsequent three bit positions from the first logic HIGH detected during a forward or reverse parse. When a logic LOW is detected within the VALID_WIND[4:0] 725 range, the boundary defining the first logic HIGH is moved to the next logic HIGH in the delay status word DLY_STAT[31:0]. This process is repeated until a series of contiguous logic HIGH bits are detected having a length defined by the VALID_WIND[4:0] 725. In this way, a transition range 720 containing mix of logic HIGH and logic LOW states is excluded from the valid phase tune range. A valid phase tune range #2 740 is determined when the transition range 720 is excluded from the valid phase tune range #1 730. The bit length defined in VALID_WIND[4:0] may vary, and may be different depending on whether the bit length is applied to a forward bit parse or a reverse parse. In addition, the bit position middle point may be determined using different techniques, including a weighted average of the current valid phase-tune range 730, 740 with previous valid phase-tune range 730, 740 for past training of the interface to external memory 100.

In some embodiments, after the valid window is determined, the state machine 250 selects the one of the plurality of phase-delayed data strobe clock signal 355 corresponding to the middle (for example, mid-point) of the valid window as the read clock signal for the memory controller 210.

One advantage of the above method 500 allows for more accurately data capture of read-back data from the external memory 100 during read transactions with the external memory 100, including when the external memory 100 has no internal clock, receives an external clock, and operates in a double data rate mode.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a," "has . . . a," "includes . . . a," or "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially," "essentially," "approximately," "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

We claim:

1. An electronic device comprising:
a memory controller configured to generate a master clock signal;
an external memory coupled to the memory controller and configured to:
receive the master clock signal,
provide a data strobe (DS) clock signal to the memory controller, the DS clock signal being a phase-delayed version of the master clock signal;
a plurality of cascaded delay elements configured to receive an input source clock signal and generating a plurality of phase-delayed data strobe clock signals;
a delay multiplexer configured to receive the plurality of phase-delayed data strobe clock signals and configured to output one of the plurality of phase-delayed data strobe clock signals;
a digital block formed by a plurality of static storage elements (SSE) configured to capture read-back data received from the external memory over data lines when activated and configured to receive the one of the plurality of phase-delayed data strobe clock signals;
a digital block demultiplexer configured to selectively activate static storage elements of the plurality of static storage elements to capture a portion of the received read-back data; and
a state machine configured to
synchronize a first selection signal to the delay multiplexer and a second selection signal to the digital block demultiplexer to sequentially select a targeted pair of the plurality of static storage elements for each of the plurality of phase-delayed data strobe clock signals such that a portion of the received read-back data is captured by each targeted pair of the plurality of static storage elements in response to an associated one of the plurality of phase-delayed data strobe clock signals,
determine which of the plurality of phase-delayed data strobe clock signals resulted in known valid data being captured by the digital block based on a comparison of the portion of the received read-back data captured by each targeted pair of the plurality of static storage elements to the known valid data,
select one of the plurality of phase-delayed data strobe clock signals that resulted in valid data being captured as a read clock signal for the memory controller to capture read data from the external memory.

2. The electronic device of claim 1, wherein transitions of the DS clock signal are synchronous to, and in phase with, transitions of read-back data signals provided by the external memory to the memory controller.

3. The electronic device of claim 1, wherein the external memory operates based on the master clock signal and has no internal clock.

4. The electronic device of claim 1, wherein the state machine is further configured to:
determine a valid window of the plurality of phase-delayed data strobe clock signals that resulted in valid data being captured by the digital block; and
select a mid-point of the valid window of the plurality of phase-delayed data strobe clock signals as the read clock signal.

5. The electronic device of claim 1, wherein the external memory is further configured to operate in a double data rate (DDR) mode.

6. The electronic device of claim 1, further comprising a plurality of registers configured to store the portion of the received read-back data from the plurality of static storage elements.

7. The electronic device of claim 6, further comprising a comparator coupled to the plurality of registers, wherein the comparator compares the portion of the received read-back data captured by each targeted pair of the plurality of static storage elements to the known valid data.

8. The electronic device of claim 7, wherein at least one selected from a group of the state machine, the plurality of cascaded delay elements, the delay multiplexer, the digital block, the digital block demultiplexer, the plurality of registers, the comparator; and the state machine is formed as part of the memory controller.

9. The electronic device of claim 1, further comprising a switch providing one of the DS clock signal or an internal clock signal as the input source clock signal, the internal clock signal having a first frequency that is an integer-N multiple of a second frequency of the DS clock signal.

10. The electronic device of claim 9, wherein when the switch provides the DS clock signal as the input source clock signal:
a first static storage element of the targeted pair of the plurality of static storage elements captures a first byte of the received read-back data at a rising clock edge of the associated one of the plurality of phase-delayed data strobe clock signals, and
a second static storage element of the targeted pair of the plurality of static storage elements captures a second byte of the received read-back data at a falling clock edge of the associated one of the plurality of phase-delayed data strobe clock signals.

11. The electronic device of claim 9, wherein when the switch provides the internal clock signal as the input source clock signal:
a first static storage element of the targeted pair of the plurality of static storage elements captures a first byte of the received read-back data at a rising clock edge of the associated one of the plurality of phase-delayed data strobe clock signals, and
a second static storage element of the targeted pair of the plurality of static storage elements captures a second byte of the received read-back data at a rising clock edge that is N/2 clock periods of the associated one of the plurality of phase-delayed data strobe clock signals following the data capture by the first static storage elements when the integer-N multiple is an even number, and at a falling clock edge that is FLOOR(N/2) clock periods of the associated one of the plurality of phase-delayed data strobe clock signals following the data capture by the first static storage elements when the integer-N multiple is an odd number, wherein the FLOOR(N/2) function is a rounded down integer value of (N/2).

12. A method for adaptable phase training of high frequency clock signaling for data capture, the method comprising:
generating, with a memory controller, a master clock signal;
receiving, with an external memory, the master clock signal;
providing, with the external memory, a data strobe (DS) clock signal to the memory controller, the DS clock signal being a phase-delayed version of the master clock signal;
receiving, with a plurality of cascaded delay elements, an input source clock signal;
generating, with the plurality of cascaded delay elements, a plurality of phase-delayed data strobe clock signals;
receiving, with a delay multiplexer, the plurality of phase-delayed data strobe clock signals;
receiving, with a digital block formed by a plurality of static storage elements (SSE), read-back data received from the external memory over data lines;
synchronizing, with a state machine, a first selection signal to the delay multiplexer and a second selection signal to a digital block demultiplexer to sequentially select a targeted pair of the plurality of static storage elements for each of the plurality of phase-delayed data strobe clock signals such that a portion of the received read-back data is captured by each targeted pair of the plurality of static storage elements in response to an associated one of the plurality of phase-delayed data strobe clock signals;
determining, with the state machine, which of the plurality of phase-delayed data strobe clock signals resulted in valid data being captured by the digital block based on a comparison of the portion of the received read-back data captured by each targeted pair of the plurality of static storage elements to known valid data; and
selecting, with the state machine, one of the plurality of phase-delayed data strobe clock signals that resulted in valid data being captured as a read clock signal for the memory controller to capture read data from the external memory.

13. The method of claim 12, wherein transitions of the DS clock signal are synchronous to, and in phase with, transitions of read-back data signals provided by the external memory to the memory controller.

14. The method of claim 12, wherein the external memory operates based on the master clock signal and has no internal clock.

15. The method of claim 12, further comprising:
determining, with the state machine, a valid window of the plurality of phase-delayed data strobe clock signals that resulted in valid data being captured by the digital block; and
selecting, with the state machine, a mid-point of the valid window of the plurality of phase-delayed data strobe clock signals as the read clock signal.

16. The method of claim 12, further comprising operating the external memory in a double data rate (DDR) mode.

17. The method of claim 12, further comprising storing, using a plurality of registers, the portion of the received read-back data from the plurality of static storage elements.

18. The method of claim 12, further comprising providing, using a switch, one of the DS clock signal or an internal clock signal as the input source clock signal, the internal clock signal having a first frequency that is an integer multiple of a second frequency of the DS clock signal.

19. The method of claim 18, further comprising when the DS clock signal is provided as the input clock signal:
    capturing, with a first static storage element of the targeted pair of the plurality of static storage elements, a first byte of the received read-back data at a rising clock edge of the associated one of the plurality of phase-delayed data strobe clock signals, and
    capturing, with a second static storage element of the targeted pair of the plurality of static storage elements, a second byte of the received read-back data at a falling clock edge of the associated one of the plurality of phase-delayed data strobe clock signals.

20. The method of claim 18, further comprising when the internal clock signal is provided as the input clock signal:
    capturing, with a first static storage element of the targeted pair of the plurality of static storage elements, a first byte of the received read-back data at a rising clock edge of the associated one of the plurality of phase-delayed data strobe clock signals, and
    capturing, with a second static storage element of the targeted pair of the plurality of static storage elements, a second byte of the received read-back data at rising clock edge that is N/2 clock periods of the associated one of the plurality of phase-delayed data strobe clock signals following the data capture by the first static storage elements when the integer-N multiple is an even number and at a falling clock edge that is FLOOR(N/2) clock periods of the associated one of the plurality of phase-delayed data strobe clock signals following the data capture by the first static storage elements when the integer-N multiple is an odd number, wherein the FLOOR(N/2) function is a rounded down integer value of (N/2).

* * * * *